United States Patent
Wang et al.

(10) Patent No.: US 10,389,358 B1
(45) Date of Patent: Aug. 20, 2019

(54) TRANSMIT-RECEIVE SWITCH

(71) Applicant: Apple Inc., Cupertino, CA (US)

(72) Inventors: Hongrui Wang, San Diego, CA (US);
Sohrab Emami-Neyestanak, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/125,133

(22) Filed: Sep. 7, 2018

(51) Int. Cl.
*H04B 1/44* (2006.01)
*H03K 19/0185* (2006.01)
*H04B 1/48* (2006.01)

(52) U.S. Cl.
CPC .......... *H03K 19/0185* (2013.01); *H04B 1/48* (2013.01)

(58) Field of Classification Search
CPC .............. H04B 1/44; H04B 1/48; H04B 1/18
See application file for complete search history.

(56) References Cited

U.S. PATENT DOCUMENTS

| | | | |
|---|---|---|---|
| 8,004,311 B2 * | 8/2011 | Kim | G11C 7/1051 326/68 |
| 9,170,967 B2 * | 10/2015 | Rettig | H04L 12/403 |
| 9,331,720 B2 * | 5/2016 | Presti | H04B 1/0458 |

\* cited by examiner

*Primary Examiner* — Tuan Pham
(74) *Attorney, Agent, or Firm* — Meyertons, Hood, Kivlin, Kowert & Goetzel, P.C.; Erik A. Heter

(57) ABSTRACT

A transmit-receive (T/R) switch is disclosed. An apparatus including a T/R switch includes a transceiver to transmit signals to an antenna and to receive signals from the antenna. The signals are conveyed to and from the transceiver by a T/R switch. The T/R switch includes a transmit path and a receive path. The receive path includes a three-port inductor having a first terminal coupled to an input/output (I/O) terminal of the T/R switch and a second terminal coupled to a first pass transistor, and a third terminal. A pull-down transistor is coupled between the third terminal and a ground node. When active, the pull-down transistor pulls the receive path down toward ground.

20 Claims, 9 Drawing Sheets

TRANSMIT-RECEIVE SWITCH

BACKGROUND

Technical Field

This disclosure is directed to wireless systems, and more particularly, shared antenna systems having a transmit-receive switch.

Description of the Related Art

In some wireless systems, an antenna may be shared by both a transmit path and a receive path. In such systems, a transmit-receive (or T/R) switch may be employed to switch the system between a transmit mode and a receive mode. A T/R switch may include separate paths to convey signals for transmission and reception. These two paths may be coupled to one another at a common junction that is further coupled to an antenna.

Commonly used T/R switches include individual switches coupled in series with other components in the system in which they are implemented. For example, a T/R switch may include series-coupled switched in each of the transmit and receive paths. During operation as a transmitter, the series switch in the transmit path may be close, while the series switch in the receive path is open. Conversely, the series switch in the receive path is closed during operation in the receive mode, while the series switch in the transmit path is open.

A transmit-receive (T/R) switch is disclosed. In one embodiment, an apparatus including a T/R switch includes a transceiver to transmit signals to an antenna and to receive signals from the antenna. The signals are conveyed to and from the transceiver by a T/R switch. The T/R switch includes a transmit path and a receive path. The receive path includes a three-port inductor having a first terminal coupled to an input/output (I/O) terminal of the T/R switch and a second terminal coupled to a first pass transistor, and a third terminal. A pull-down transistor is coupled between the third terminal and a ground node. When active, the pull-down transistor pulls the receive path down toward ground.

In one embodiment, a pull-up transistor is coupled to the transmit path. When the T/R switch is operating in the transmit mode, both the pull-up and pull-down transistors are active, with the pull-up transistor providing power to the transmit path. In another embodiment, the transmit path includes a transformer in lieu of the pull-up transistor. A signal is conveyed from a transmitter to the antenna via the transformer in the transmit path.

BRIEF DESCRIPTION OF THE DRAWINGS

The following detailed description makes reference to the accompanying drawings, which are now briefly described.

Figure 1:
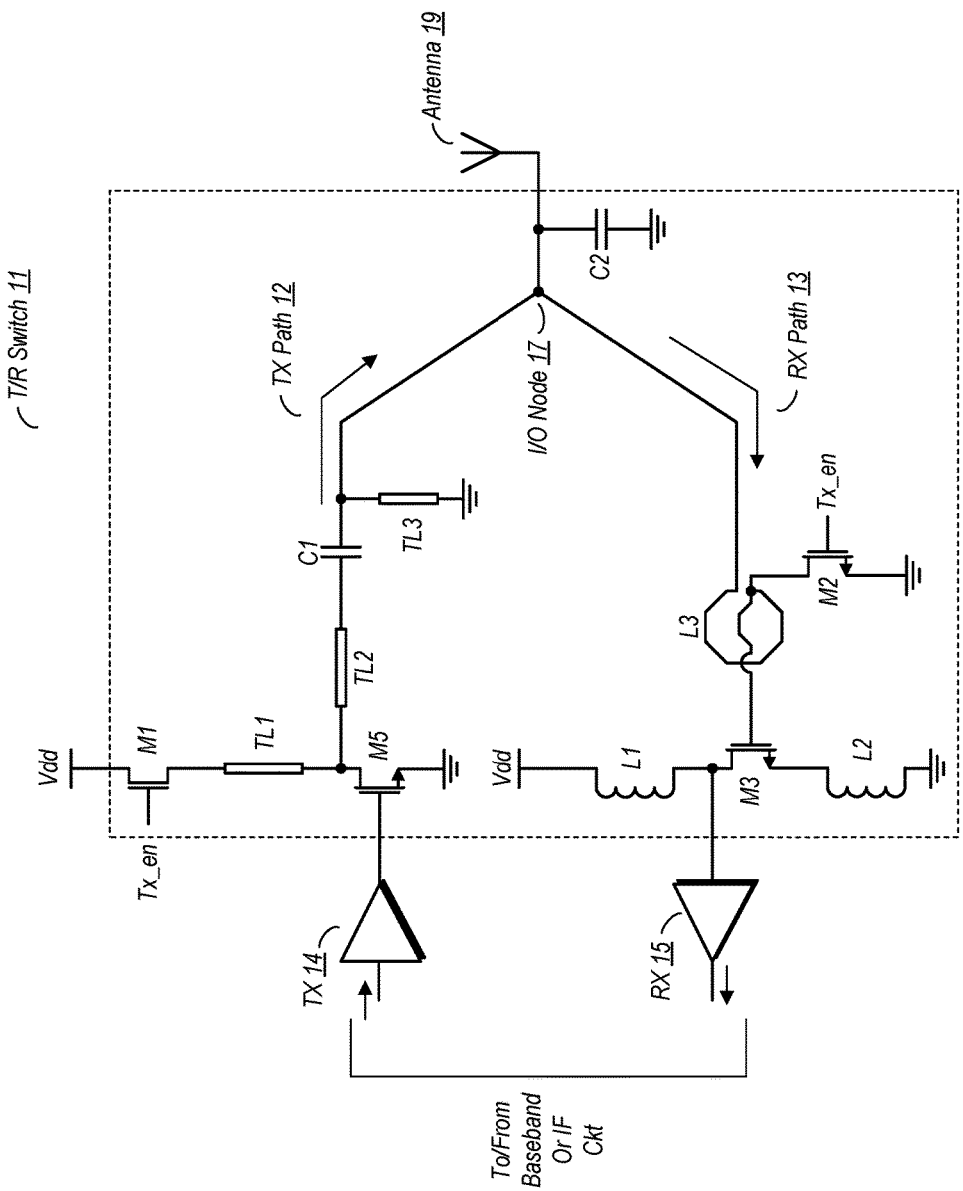
FIG. 1 is a schematic diagram of a first embodiment of a T/R switch.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a T/R switch that may be implemented in a communications system in which a single antenna is shared by both a transmitter and receiver. In contrast to many previous T/R switch implementations, the T/R switch of the present disclosure does not include series-coupled switches. The configuration of the T/R switch disclosed herein may overcome various problems of previous T/R switches.

One of the problems of a T/R switch having series-coupled switches in the transmit and receive paths is insertion loss. This insertion loss can degrade receive sensitivity during operation in a receive mode, while reducing power efficiency when operating in the transmit mode.

Another problem with T/R switches implemented using series-coupled switches is linearity. The series-coupled switches in such embodiments may be a bottleneck for P1db (the output power when the transmit amplifier is at the 1 dB compression point) and Psat (the transmit power amplifier output power when the amplifier is saturated).

Reliability is yet another factor that may be adversely affected using the series-coupled switches. In such embodiments, leakage of a power amplifier signal can potentially degrade or even damage receiver devices.

Various embodiments of the T/R switch disclosed herein may overcome the problems discussed above. In particular, the T/R switch disclosed herein may have a lower insertion loss (leading to better efficiency when transmitting and better sensitivity when receiving), better linearity, and better reliability. Furthermore, the T/R switch disclosed herein may be implemented on an integrated circuit within a relatively small area.

As discussed herein, a T/R switch may be implemented in an apparatus that includes a transceiver to transmit signals to an antenna and to receive signals from the antenna. The transceiver of one embodiment includes a power amplifier configured to drive an outgoing signal for transmission onto the transmit path, and further includes a low noise amplifier circuit configured to receive an incoming signal received via the receive path. A T/R switch is coupled between the antenna and the transceiver. The T/R switch operates in one of a transmit mode or a receive mode, and switch includes a transmit path and a receive path. The receive path includes a three-port inductor having a first terminal coupled to an input/output (I/O) terminal of the T/R switch and a second terminal coupled to a first pass transistor, and a third terminal. A pull-down transistor is coupled between the third terminal and a ground node. The pull-down transistor, when active, pulls the receive path to ground.

In one embodiment, a pull-up transistor is coupled to the transmit path. The pull-up transistor is further coupled to a voltage source and, when active, provides power to the transmit path. In this embodiment, the T/R switch operates in a transmit mode when the pull-up and pull-down transistors are both active, and operates in a receive mode when both the pull-up and pull-down transistors are both inactive.

In another embodiment, the transmit path includes a transformer having a first winding and second winding. The first winding is coupled between an I/O node and the ground node. In both embodiments, the T/R switch operates in a transmit mode when the pull-down transistor is active and operates in a receive mode when the pull-down transistor is inactive.

FIG. 1 is a schematic diagram of a first embodiment of a T/R switch. In the embodiment shown, T/R switch 11 includes a transmit path 12 and a receive path 13, which are coupled to one another at I/O node 17. I/O node 17 is in turn coupled to antenna 19, through which radio signals may be transmitted (when T/R switch 11 is in the transmit mode) and received (when T/R switch 11 is in the receive mode). A capacitor C2 is coupled between I/O node 17 and a ground node, and may shunt some signals to ground during operation. It is noted that, in various embodiments, C2 may be representative of a bump/pad capacitance (e.g., a parasitic capacitance) instead of being an actual discrete capacitor.

T/R switch 11 in the embodiment shown is coupled to a transmitter 14 and a receiver 15, which may be part of a transceiver circuit. In one embodiment, receiver 15 is implemented as (or includes) a low noise amplifier, while transmitter 14 is implemented as (or includes) a power amplifier. During operation in the transmit mode, circuitry in transmitter 14 may drive radio signals (e.g., signals having a radio frequency, or RF, as the center frequency) that are received from a baseband or IF (intermediate frequency) circuit, depending on the radio architecture. During operation in the receive mode, radio signals received by antenna 19 may be conveyed to circuitry in receiver 15, and back to a baseband unit (for down conversion and demodulation) or to an IF unit (for shifting the carrier frequency to an intermediate frequency). In this embodiment, a pull-up transistor M1 is coupled to transmit path 12, via transmission line TL1. Transmission line TL1 may be implemented using any suitable type of transmission line configuration (e.g., microstrip, stripline, waveguide, etc.). A pull-down transistor, M2, is coupled to receive path 13. Both transistors M1 and M2 are coupled to receive an enable signal, Tx_en, on their respective gate terminals (e.g., via a control circuit). When the illustrated embodiment is operating in the transmit mode, Tx_en is asserted, activating both pull-up transistor M1 and pull-down transistor, M2. When the embodiment shown in FIG. 1 is operating in the receive mode, both pull-up transistor M1 and pull-down transistor M2 are inactive, with Tx_en de-asserted.

In the embodiment shown, the transmit path includes a transmission line and a second pass transistor having a drain terminal coupled to the transmission line. A power amplifier having an output is coupled to a gate terminal of the second pass transistor. A capacitor is coupled in series between the transmission line of the transmit path and the I/O node. During operation in a transmit mode, the transmission line is capacitive coupled to the I/O node.

As shown here, transmit path 12 is coupled to transmitter 14 via transistor M5 (e.g., the second pass transistor). Transmitter 14 in this embodiment is implemented as a power amplifier used for the transmission of signals at a radio frequency. Signals driven from transmitter 14 are received on the gate terminal of M5 and transferred to the drain terminal of the same. The signals then propagate down transmit path via transmission line TL2 (which, like TL1, may be implemented using any suitable type of transmission line), through the capacitive coupling of capacitor C1 (which is low impedance with respect to the center frequency of the signal), and to antenna 19. Transmission path 12 is also coupled to another transmission line, TL3, which is further coupled to the ground node. Transmission line TL3 may present a low impedance path for some unwanted signals at frequencies other than the center frequency of the signal to be transmitted.

As noted above, receive path 13 includes a three-port inductor L3, with pull-down transistor M2 coupled between one of the terminals of L3 and ground. The first terminal of the three-port inductor (L3) is coupled to a gate terminal of the first pass transistor, M3, wherein a drain terminal of the first pass transistor is coupled to an input of a low noise amplifier that implements receiver 15. During operation in the receive mode, signals propagate from antenna 19, through inductor L3, to the gate terminal of pass transistor M3. The signals are then effectively transferred to the drain terminal of M3 and thus to the input of the low noise amplifier that implements receiver 15.

Pull-down transistor M2 in the embodiment shown includes a drain terminal coupled to one of the terminals of three-port inductor L3. During operation in the transmit mode, M2 is activated and thus this portion of the receive path is effectively pulled low, toward ground. Additional details regarding operation of the receive path during the transmit and receive modes are discussed below.

In one embodiment, a T/R switch includes a first inductor coupled between a source terminal of the first pass transistor and the ground terminal, and a second inductor coupled between a drain terminal of the first pass transistor and a voltage source. As shown in FIG. 1, inductors L1 and L2 are coupled to receive path 13. Inductor L1 is coupled between the drain terminal of M3 and a voltage source Vdd. Inductor L2 is coupled between the source terminal of M3 and ground. Inductors L1 and L2 provide sufficient impedance at the center frequency to allow voltages to be generated on the input to receiver 15 commensurate with variations in the received radio signal.

Figure 2:
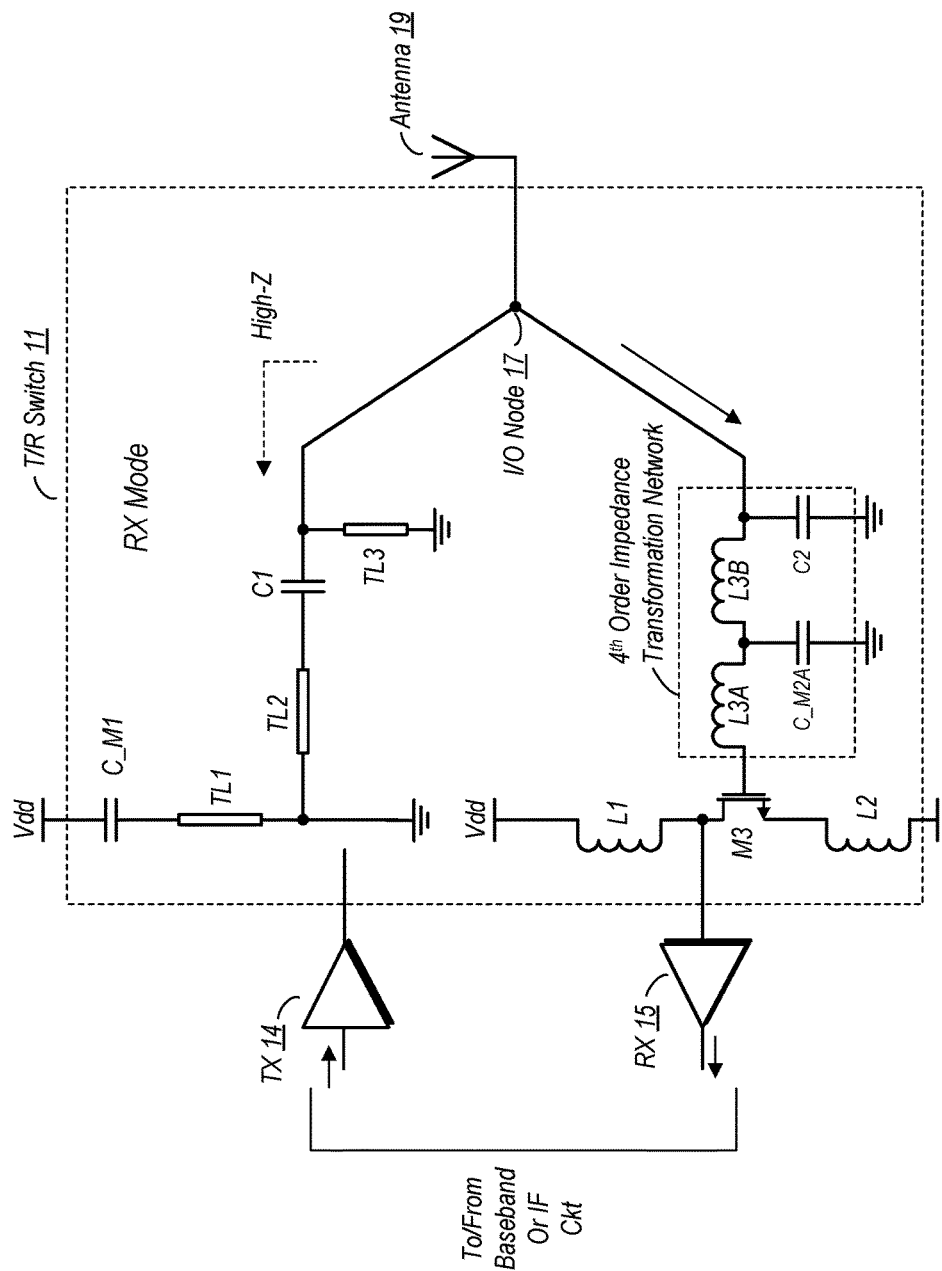
FIG. 2 is an equivalent schematic illustrating operation of the first embodiment of a T/R switch in a receive mode.

FIG. 2 is an equivalent schematic of T/R switch 11 when operating in the receive mode. When T/R switch is operating in the receive mode, receive path 13 forms a fourth-order impedance transformation network. As shown here, the equivalent circuit when operating in the receive mode includes two inductors, L3A and L3B, which are segments of the three-port inductor L3. Capacitance C_M2A is formed by transistor M2 when inactive. The fourth-order impedance network converts 50 ohms to the optimal source impedance. Meanwhile, positive coupling between L3A and L3B improves insertion loss and may help reduce the needed inductor area. Signals received via antenna 19, when operating in the receive mode, propagate to and through the fourth order transformation network to the gate terminal of M3. The signal received on the gate terminal of M3 is largely reproduced on its drain terminal, and thus conveyed to the input of the receiver 15.

Transmit path 12, when operating in the receive mode, operates as a high impedance path relative to signals received by antenna 19. Transmitter 14 in this embodiment causes transistor M5 to be activated, which effectively forms a short circuit from its drain terminal (at the junction of TL1 and TL2) to ground. Transistor M1 is inactive, and thus the capacitance C_M1 blocks the DC voltage Vdd from being conveyed to transmit path 12 via transmission line TL1. Capacitors C1 and transmission lines TL2 and TL3 resonate at operating frequency to form a high impedance path looking into the output of transmitter 14.

Figure 3:
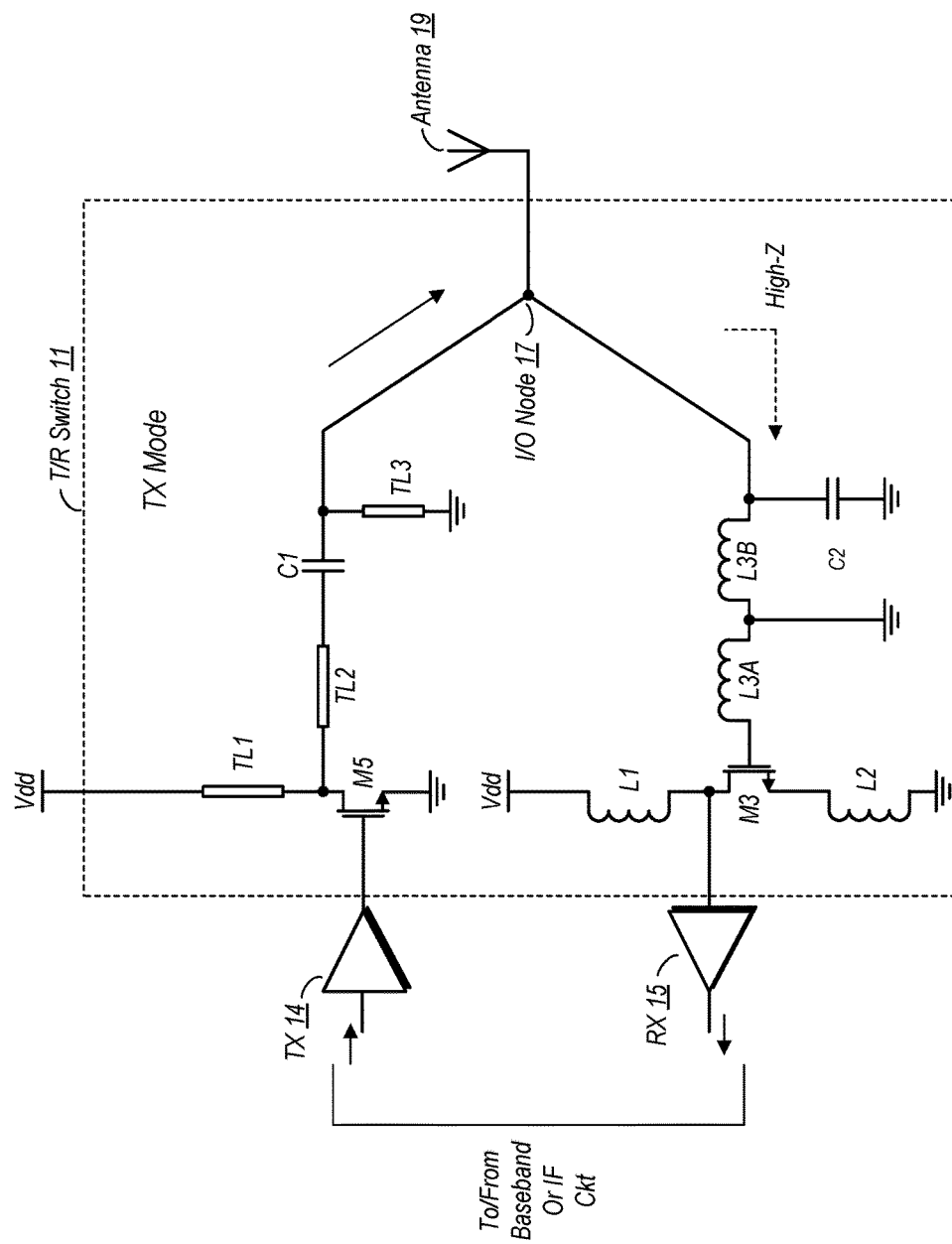
FIG. 3 is an equivalent schematic illustrating operation of the first embodiment of a T/R switch in a transmit mode.

FIG. 3 is an equivalent schematic of T/R switch 11 when operating in the transmit mode. When in the transmit mode, both transistors M1 and M2 are active. When M1 is active, transmit path 12 receives power, through TL1, from Vdd. Accordingly, an output impedance matching network is effectively constructive by TL1, TL2, TL3, and C1. Signals output from the power amplifier, transmitter 14, are conveyed to the gate of M5 and reproduced on transmit path 12. The signals then propagate down transmit path 12 to antenna 19, where they are transmitted as radio signals.

When in the transmit mode, transistor M2 is active, pulling down the receive path 13 (particularly, the junction between L3A and L3B) toward ground. As a result, receive path 13 is effectively short circuited at this particular node. Furthermore, the partial inductance L3B resonates with the capacitance of C2. This forms a high impedance path looking into receive path 13 and thus the input to receiver 15.

Figure 4:
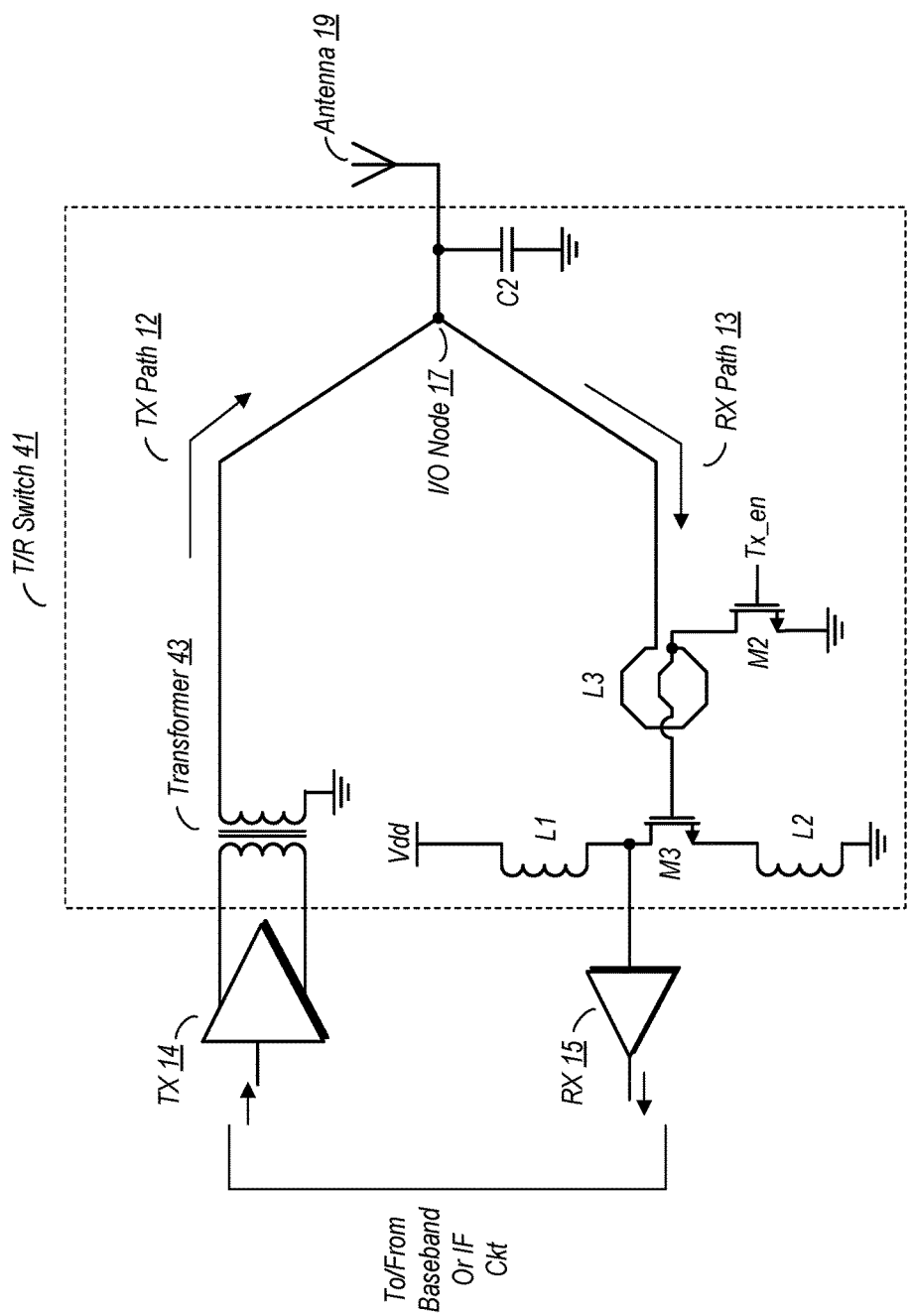
FIG. 4 is a schematic diagram of a second embodiment of a T/R switch.

FIG. 4 is a schematic diagram of another embodiment of a T/R switch. T/R switch 41 as shown in FIG. 4 includes a transformer having a first winding and second winding, with the first winding is electrically coupled between the I/O node and the ground node. This embodiment does not include the pull-up transistor M1 as does T/R switch 11 discussed above. Thus, T/R switch 41 is operates in a transmit mode when the pull-down transistor is active and operates in a receive mode when the pull-down transistor is inactive. An embodiment of an apparatus including T/R switch 41 includes a power amplifier (e.g., transmitter 14) having a differential output coupled to the second winding of the transformer.

T/R switch 41 in the embodiment shown does not include the series-coupled capacitor C2 and the series-coupled transmission line TL2 as does the embodiment of TR switch 11 shown in FIG. 1. Thus, there is effectively a short circuit between I/O node 17 and one terminal of transformer 43, and thus the first winding of transformer 43 is electrically coupled between I/O node 17 and the ground node. The second winding of transformer 43 is coupled to a differential output of the transmitter 14. This embodiment does include the transmission line TL3 coupled between transmit path 12 and ground. Receive path 13 and its associated circuitry (e.g., L1, L2, M2) is largely the same in this embodiment as the embodiment of T/R switch 11 discussed above.

Figure 5:
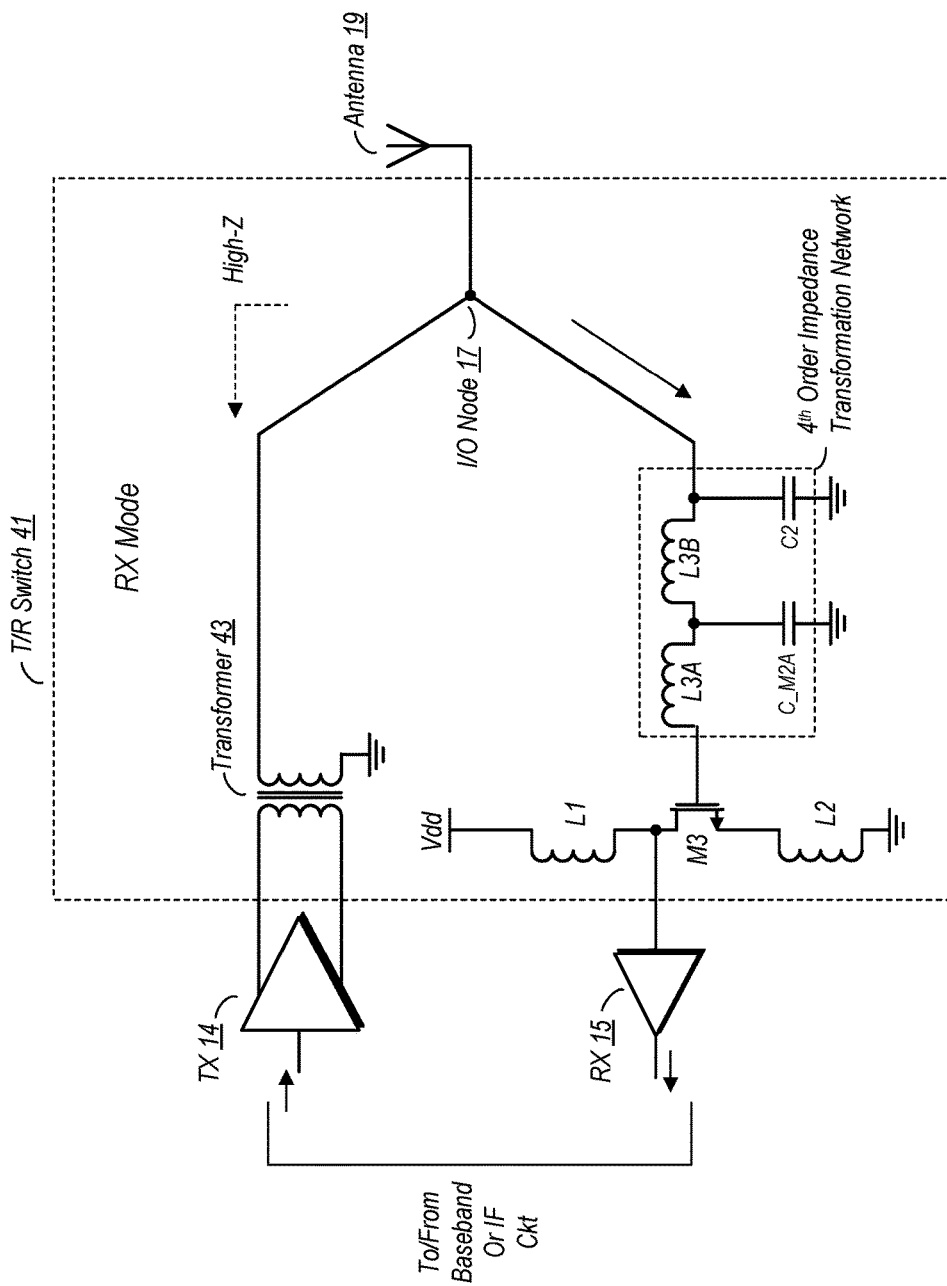
FIG. 5 is an equivalent schematic illustrating the second embodiment of a T/R switch operating in the receive mode.

FIG. 5 is a schematic of an equivalent circuit of T/R switch 41 operating in the receive mode. As with the embodiment of T/R switch 11 as discussed above, operation in the receive mode results in the effective formation of a fourth-order impedance transformation network in the receive path, including L3A, L3B, C_M2A (formed by the deactivation of M2) and C2. This impedance transformation network converts 50 ohm impedance to the optimal source impedance, while the positive coupling between L3A and L3B improves insertion loss.

During operation in the receive mode, transmitter 14 or a power amplifier therein is powered off. Accordingly, transmit path 12 becomes a high impedance path looking inward from I/O node 17.

Figure 6:
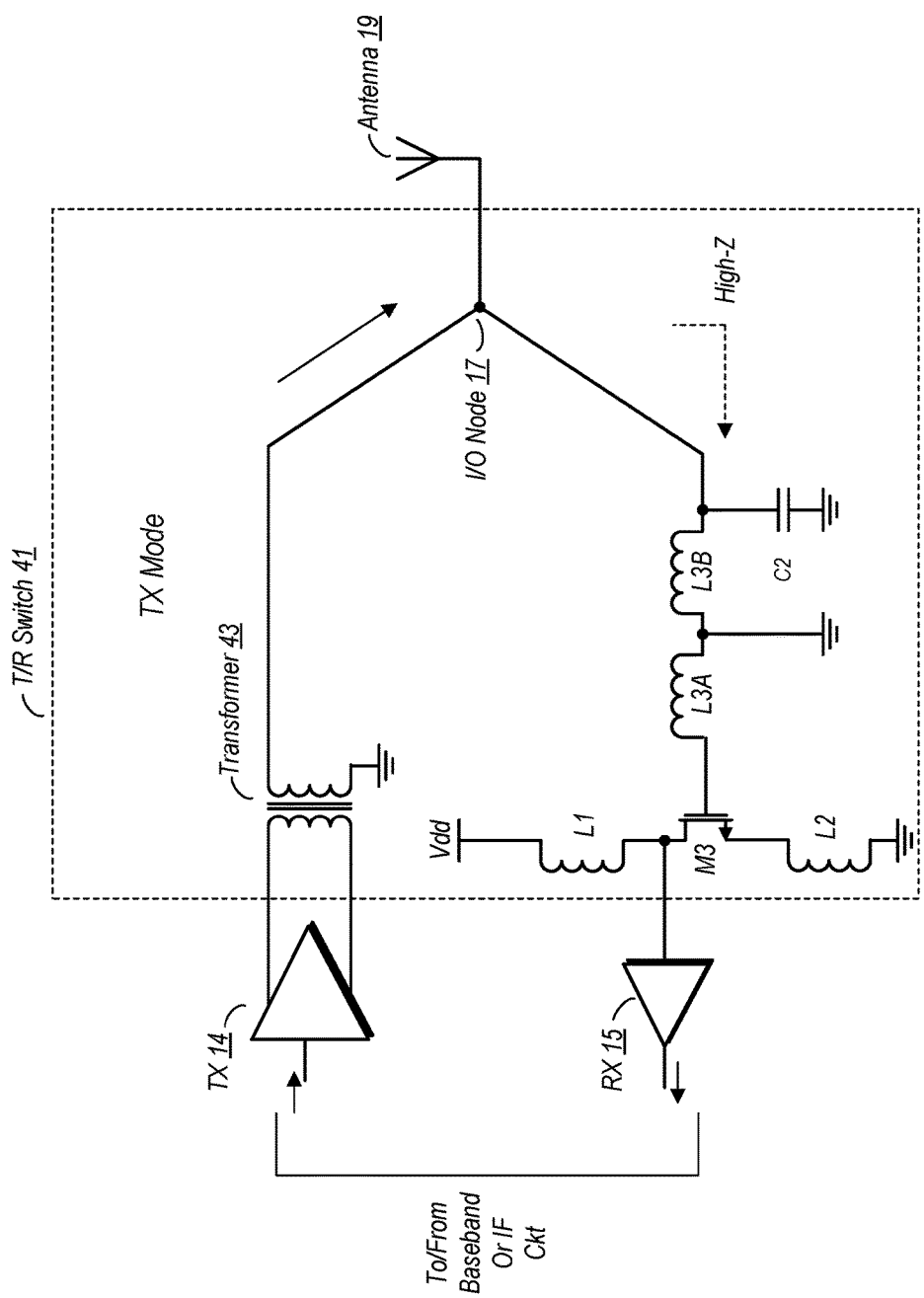
FIG. 6 is an equivalent schematic illustrating the second embodiment of a T/R switch operating in the transmit mode.

FIG. 6 is a schematic diagram of an equivalent circuit of T/R switch 41 when operating in the transmit mode. In this embodiment, the output signals from transmitter 14 it conveyed to the second winding of transformer 43 and transferred to the first winding. Thereafter the signals propagate down transmit path 12 to antenna 19, where they are transmitted as radio signals. Transformer 43 is designed and implemented in such a manner to serve as an output impedance matching network to convert a 50 ohm impedance to a desired optimal impedance.

With respect to receive path 13 during operation in the transmit mode, transistor M2 is activated, and thus the junction between L3A and L3B is pulled down and effectively short circuited to ground. Meanwhile, the partial inductance of L3B resonates with capacitor C2 to form a high impedance path looking from I/O node 17 to the input of receiver 15.

Figure 7:
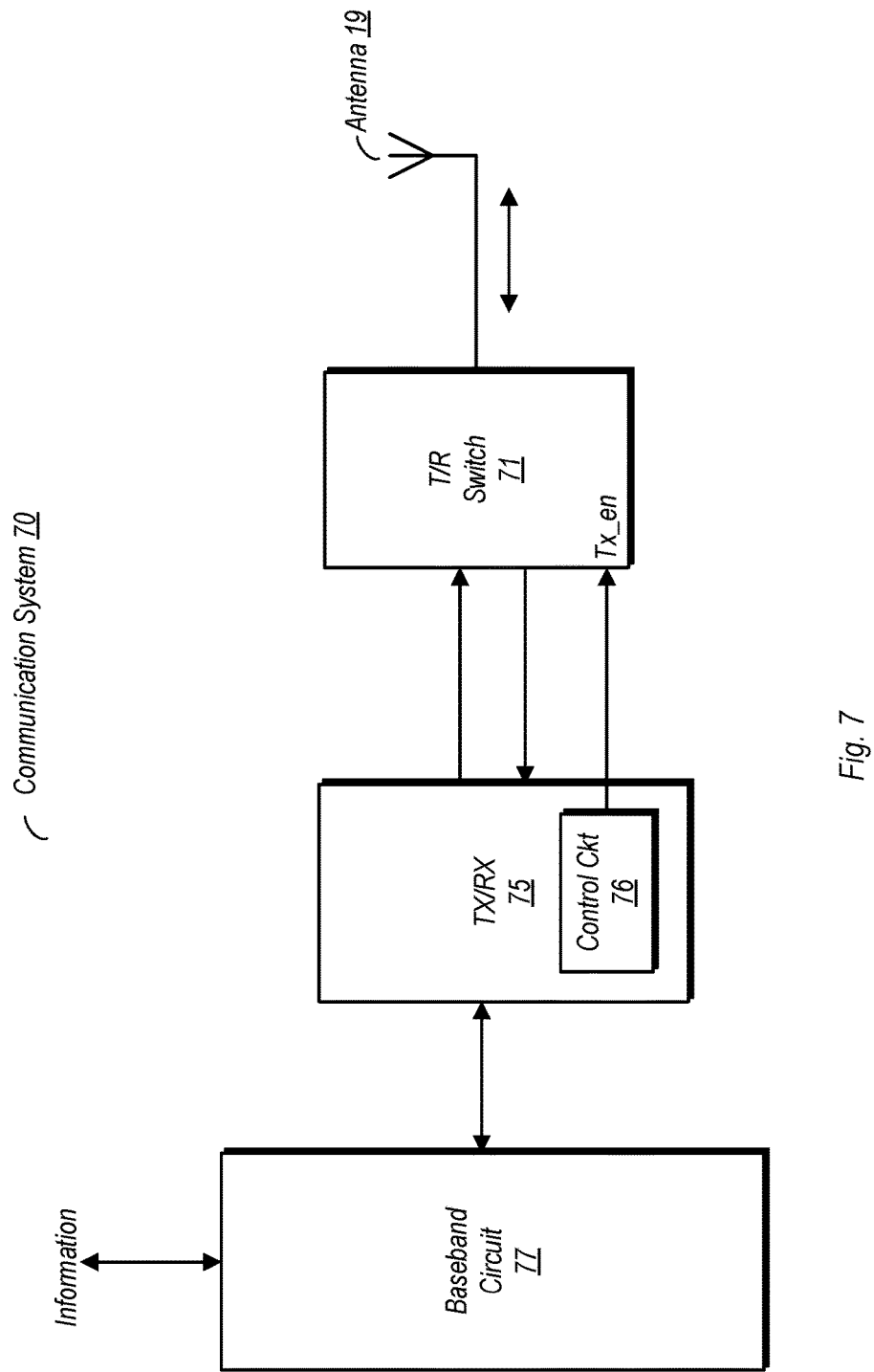
FIG. 7 is a block diagram of one embodiment of a communications system.

FIG. 7 is a block diagram of a communications system having a T/R switch.

Communications system 70 as shown here may be implemented at least partly on an integrated circuit (e.g., the various functional circuit blocks shown here). The integrated circuit may be dedicated to implementing communications system in some embodiments, while in other embodiments, the system may be implemented as part of an integrated circuit having other functionality (e.g., implemented as part of a system-on-a-chip). In various embodiments, a communications system as disclosed herein includes a transceiver coupled to a baseband circuit, where the transceiver includes a transmitter coupled to receive a signal to be transmitted from the baseband circuit and receiver coupled to provide a received signal to the baseband circuit. A communications system as disclosed herein also includes a T/R switch coupled to the transceiver, the T/R switch having a transmit path and a receive path. The receive path includes a three-port inductor having a first terminal coupled to an input/output (I/O) terminal of the T/R switch and a second terminal coupled to a first pass transistor, and a third terminal. The T/R switch also includes pull-down transistor coupled between the third terminal and a ground node, wherein the pull-down transistor, when active, is configured to short-circuit the receive path to the ground node.

Communications system 70 as shown here includes a baseband circuit 77, which is coupled to transceiver 75. In turn, transceiver 75 is coupled to a T/R switch 71. Transceiver 75 includes a control circuit 76 that may be used to switch T/R switch 71 between a transmit mode and a receive mode. T/R switch 71 is coupled to antenna 19. During operation in a transmit mode, T/R switch 71 conveys signals to antenna 19 for transmission as radio signals. During operation in a receive mode, T/R switch may receive signals from antenna 19.

In the embodiment shown in FIG. 7, communications system 70 includes a baseband circuit 77 coupled to receive and convey information signals to other units/functional circuit blocks in a larger system. The information signal may be digital information in one embodiment. Baseband circuit 77 may provide a number of functions to handle information according to one or more communications protocols. Furthermore, baseband circuit 77 may also include modulation and demodulation circuitry, as well as circuitry for up and down conversion of signals with respect to carrier frequencies.

It is noted here that communications system 70 is but one example of a wide variety of embodiments of a communications system in which a T/R switch may be implemented in accordance with this disclosure. Accordingly, such embodiments of a communications system may fall within the scope of this disclosure.

In one embodiment, communications system 70 implements a direct conversion architecture. Accordingly, baseband circuitry 77 may include a mixer for up-converting a modulated baseband signals directly to an RF (radio frequency) signals before conveying the same to transceiver 75. Similarly, in a direct conversion architecture, baseband circuit 77 may receive signals having a center frequency at RF and down convert these signals to a baseband frequency for demodulation. In another embodiment, communications system may implement a heterodyne architecture, in which frequencies are up or down converted to an intermediate frequency (IF) prior to conversion to the RF or baseband frequency, respectively.

Baseband circuit 77 in the embodiment is coupled to transceiver 75. In one embodiment, transceiver 75 may include both a transmitter (e.g., transmitter 14 as discussed above) and a receiver (e.g., receiver 15 as discussed above). In one embodiment, the transmitter may be implemented as, or may include, a power amplifier, while the receiver may include, or may be implemented as, a low noise amplifier. The transmitter may be used to convey signals for transmission as radio signals. The receiver may receive signals received as radio signals via antenna 19. Transceiver 75 in the embodiment shown includes a control circuit 76 that may switch T/R switch 71 between the transmit and receive modes. In some embodiments, control circuit 76 may be implemented in another circuit unit, e.g., within baseband circuit 77.

T/R switch 71 in the embodiment shown may be any of the embodiments discussed herein, and in particular, variations of T/R switch 11 of FIG. 1 or T/R switch 41 of FIG. 4. Generally speaking, T/R switch 71 may be any type of T/R switch that falls within the scope of this disclosure.

Figure 8:
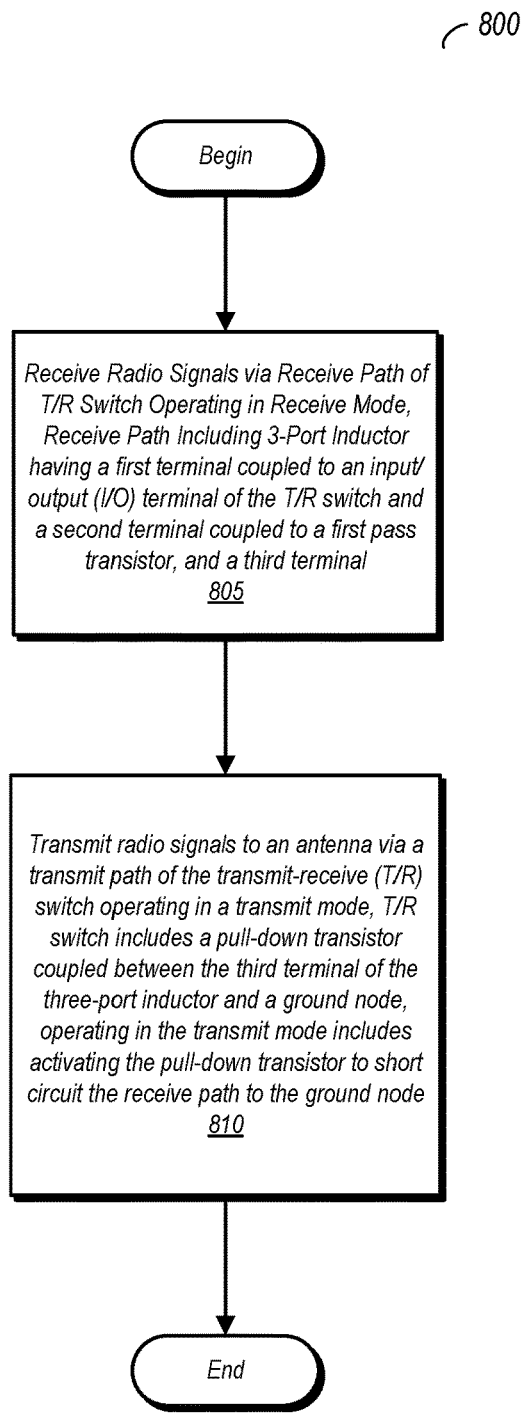
FIG. 8 is a flow diagram of one embodiment of a method for operating a T/R switch.

FIG. 8 is a flow diagram of one embodiment of a method for operating a T/R switch. Method 800 may be performed with any embodiment of a T/R switch as disclosed herein, including those discussed above with reference to FIGS. 1-7.

Method 800 includes a transceiver receiving radio signals via a receive path of a T/R switch operating in a receive mode, wherein the receive path of the T/R switch includes a three-port inductor having a first terminal coupled to an input/output (I/O) terminal of the T/R switch and a second terminal coupled to a first pass transistor, and a third terminal (block 805). Method 800 further includes the transceiver transmitting radio signals, wherein transmitting radio signals comprise the transceiver conveying signals to an antenna via a transmit path of the transmit-receive (T/R)

switch operating in a transmit mode, wherein the T/R switch also includes a pull-down transistor coupled between the third terminal of the three-port inductor and a ground node, and wherein operating in the transmit mode further comprises activating the pull-down transistor to short circuit the receive path to the ground node (block 805).

In one embodiment of method 800, operating in the transmit mode includes providing power to the transmit path, wherein providing power to the transmit path comprises activating a pull-up transistor coupled between a voltage source and the transmit path. Operating in the receive mode in this embodiment includes de-activating the pull-up transistor and the pull-down transistor. This embodiment also includes conveying a signal to be transmitted from a power amplifier circuit to the transmit path, via a first pass transistor, when operating in the transmit mode, and conveying a received signal from the receive path to a receiver circuit, via a second pass transistor, when operating in the receive mode.

In another embodiment of a T/R switch the transmit path includes a transformer, and thus a corresponding method embodiment includes, when operating in the transmit mode, conveying signals to the antenna via the transformer. Various method embodiments also includes the receive path, when the T/R switch is operating in the receive mode, forming a fourth order impedance transformation network.

Figure 9:
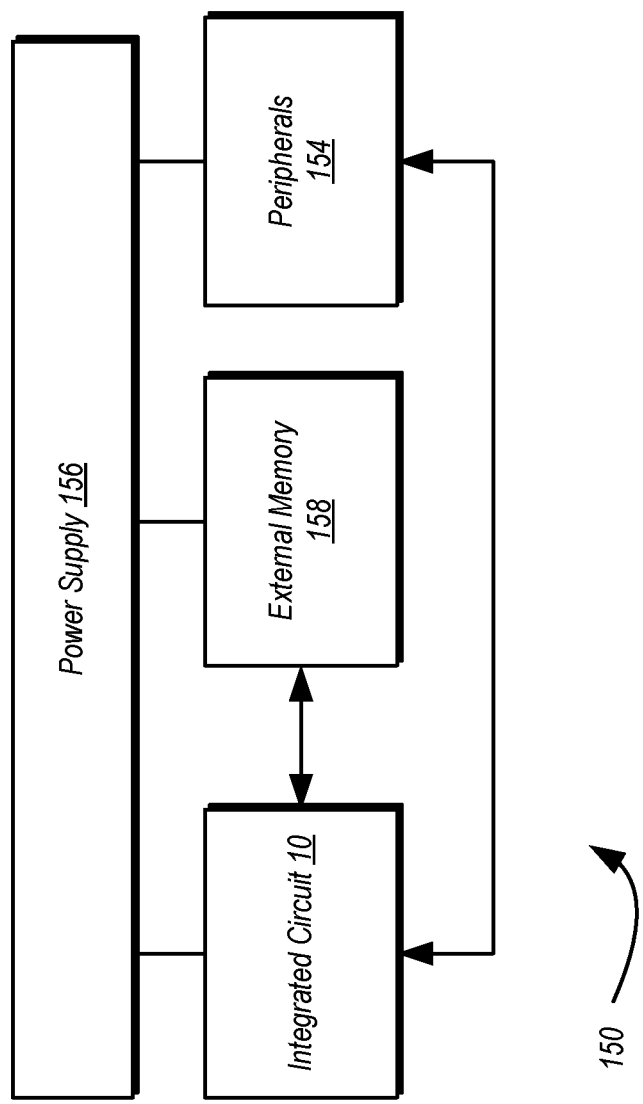
FIG. 9 is a block diagram of one embodiment of one embodiment of an example system.

Turning next to FIG. 9, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

In some embodiments, the peripherals 154 may include one or more integrated circuits that include various embodiments of the circuitry discussed above with reference to FIGS. 1-7, and capable of carrying out various embodiments of the method discussed above with reference to FIG. 8.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
 a transceiver configured to transmit signals to an antenna and further configured to receive signals from the antenna; and
 a transmit-receive (T/R) switch coupled between the antenna and a transceiver, wherein the T/R switch is configured to operate in one of a transmit mode or a receive mode, and wherein the T/R switch includes:
 a transmit path;
 a receive path including a three-port inductor having a first terminal coupled to an input/output (I/O) node of the T/R switch and a second terminal coupled to a first pass transistor, and a third terminal;
 a pull-down transistor coupled between the third terminal and a ground node, wherein the pull-down transistor, when active, is configured to pull the receive path toward ground.

2. The apparatus as recited in claim 1, further comprising a pull-up transistor coupled to the transmit path, wherein the pull-up transistor is further coupled to a voltage source, and wherein the pull-up transistor is configured to, when active, provide power to the transmit path.

3. The apparatus as recited in claim 2, wherein the T/R switch is configured to operate in a transmit mode when the pull-up and pull-down transistors are both active, and further configured to operate in a receive mode when both the pull-up and pull-down transistors are both inactive.

4. The apparatus as recited in claim 2, wherein the transmit path further includes a transmission line and a second pass transistor having a drain terminal coupled to the transmission line, wherein apparatus further comprises a power amplifier having an output coupled to a gate terminal of the second pass transistor.

5. The apparatus as recited in claim 4, further comprising a capacitor coupled in series between the transmission line of the transmit path and the I/O node, wherein during operation in a transmit mode, the transmission line is capacitive coupled to the I/O node.

6. The apparatus as recited in claim 1, wherein the transmit path includes a transformer having a first winding and second winding, wherein the first winding is electrically coupled between the I/O node and the ground node, and wherein the T/R switch is configured to operate in a transmit mode when the pull-down transistor is active and operate in a receive mode when the pull-down transistor is inactive.

7. The apparatus as recited in claim 6, further comprising a power amplifier having a differential output coupled to the second winding of the transformer.

8. The apparatus as recited in claim 1, wherein the first terminal of the three-port inductor is coupled to a gate terminal of the first pass transistor, and wherein a drain terminal of the first pass transistor is coupled to an input of a low noise amplifier.

9. The apparatus as recited in claim 1, further comprising a first inductor coupled between a source terminal of the first pass transistor and the ground node, and a second inductor coupled between a drain terminal of the first pass transistor and a voltage source.

10. A method comprising:

a transceiver receiving radio signals via a receive path of a transmit-receive (T/R) switch operating in a receive mode, wherein the receive path of the T/R switch includes a three-port inductor having a first terminal coupled to an input/output (I/O) node of the T/R switch and a second terminal coupled to a first pass transistor, and a third terminal; and the transceiver transmitting radio signals, wherein transmitting radio signals comprise the transceiver conveying signals to an antenna via a transmit path of the T/R switch operating in a transmit mode;

wherein the T/R switch includes a pull-down transistor coupled between the third terminal of the three-port inductor and a ground node, and wherein operating in the transmit mode further comprises activating the pull-down transistor to pull the receive path to ground.

11. The method as recited in claim 10, wherein operating in the transmit mode further comprises providing power to the transmit path, wherein providing power to the transmit path comprises activating a pull-up transistor coupled between a voltage source and the transmit path.

12. The method as recited in claim 11, wherein operating in the receive mode further comprises de-activating the pull-up transistor and the pull-down transistor.

13. The method as recited in claim 11, further comprising:
conveying a signal to be transmitted from a power amplifier circuit to the transmit path, via a first pass transistor, when operating in the transmit mode; and
conveying a received signal from the receive path to a receiver circuit, via a second pass transistor, when operating in the receive mode.

14. The method as recited in claim 10, wherein the transmit path includes a transformer, and wherein operating in the transmit mode further comprises conveying signals to the antenna via the transformer.

15. The method as recited in claim 10, wherein the receive path, when the T/R switch is operating in the receive mode, comprises a fourth order impedance transformation network.

16. A system comprising:
a transceiver coupled to a baseband circuit, the transceiver including a transmitter coupled to receive a signal to be transmitted from the baseband circuit, and further including a receiver coupled to provide a received signal to the baseband circuit; and a transmit-receive (T/R) switch coupled to the transceiver, the T/R switch having a transmit path and a receive path, wherein the receive path includes a three-port inductor having a first terminal coupled to an input/output (I/O) node of the T/R switch and a second terminal coupled to a first pass transistor, and a third terminal;

wherein the T/R switch further includes pull-down transistor coupled between the third terminal and a ground node, wherein the pull-down transistor, when active, is configured to pull the receive path to ground.

17. The system as recited in claim 16, further comprising a pull-up transistor coupled to the transmit path, wherein the pull-up transistor is further coupled to a voltage source, and wherein the pull-up transistor is configured to, when active, provide power to the transmit path, wherein the T/R switch is configured to operate in a transmit mode when the pull-up and pull-down transistors are both active, and further configured to operate in a receive mode when both the pull-up and pull-down transistors are both inactive.

18. The system as recited in claim 16, wherein the transmit path includes a transformer having a first winding and second winding, wherein the first winding is electrically coupled between the I/O node and the ground node, and wherein the T/R switch is configured to operate in a transmit mode when the pull-down transistor is active and operate in a receive mode when the pull-down transistor is inactive.

19. The system as recited in claim 16, wherein the receive path is configured to form a fourth-order impedance transformation network when operating in a receive mode.

20. The system as recited in claim 16, wherein the transceiver includes a power amplifier configured to drive an outgoing signal for transmission onto the transmit path, and further includes a low noise amplifier configured to receive an incoming signal received via the receive path.

* * * * *